(12) United States Patent
Haji et al.

(10) Patent No.: US 6,350,664 B1
(45) Date of Patent: Feb. 26, 2002

(54) SEMICONDUCTOR DEVICE AND METHOD OF MANUFACTURING THE SAME

(75) Inventors: Hiroshi Haji, Chikushino; Shoji Sakemi, Ogoori, both of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/645,408

(22) Filed: Aug. 25, 2000

(30) Foreign Application Priority Data

Sep. 2, 1999 (JP) ............................................. 11-248360

(51) Int. Cl.$^7$ ............................................... H01L 21/46
(52) U.S. Cl. ..................... 438/459; 438/110; 438/112; 438/113; 438/459; 257/787; 257/788
(58) Field of Search ................................ 438/977, 112, 438/459, 127; 257/787, 788, 100, 433, 687

(56) References Cited

U.S. PATENT DOCUMENTS

| | | | |
|---|---|---|---|
| 4,043,027 A | * 8/1977 | Birchler et al. | 28/588 |
| 6,130,116 A | * 10/2000 | Smith et al. | 438/127 |
| 6,184,064 B1 | * 2/2001 | Jiang et al. | 438/113 |
| 6,190,946 B1 | * 2/2001 | Shin | 438/123 |
| 6,197,616 B1 | * 3/2001 | Hyuodo et al. | 438/113 |
| 6,204,091 B1 | * 3/2001 | Smith et al. | 438/108 |
| 6,221,751 B1 | * 4/2001 | Chen et al. | 438/612 |

FOREIGN PATENT DOCUMENTS

JP  8-316194  11/1996

* cited by examiner

*Primary Examiner*—John F. Niebling
*Assistant Examiner*—Olivia T Luk
(74) *Attorney, Agent, or Firm*—Parkhurst & Wendel, LLP (57) ABSTRACT

The method of manufacturing a semiconductor device of the present invention includes steps of; a resin layer forming process in which a face with electrodes of a semiconductor wafer having a plurality of semiconductor elements formed thereon is coated with a resin layer which has a function of sealing it; and a wafer thinning process in which the back face of the semiconductor wafer is ground. The method of manufacturing the semiconductor device of the present invention further includes a process of forming a conductive section on the electrodes of the semiconductor wafer with a plurality of semiconductor elements in such a manner the conductive section reaches to the electrodes. The manufacturing method of the semiconductor device of the present invention still further includes a process of cutting the semiconductor wafer having a plurality of semiconductor elements along boundaries of each semiconductor element. In the thinning process, at least one of a mechanical grinding method, a chemical etching method and a plasma etching method are employed.

22 Claims, 6 Drawing Sheets

ns of the semiconductor elements from external factors such as moisture and impurities, and a function to protect the semiconductor elements from mechanical, thermal and chemical damage.

SEMICONDUCTOR DEVICE AND METHOD OF MANUFACTURING THE SAME

FIELD OF THE INVENTION

The present invention relates to semiconductor devices and production methods for making same in which semiconductor elements having conductive sections including electrodes for external connection formed thereon.

BACKGROUND OF THE INVENTION

Semiconductor devices which are mounted on circuit boards of electronic devices are manufactured in such a manner that pins or metallic bumps of lead frames are connected to electrodes for external connection of a semiconductor element on which circuit pattern is formed, and then the whole semiconductor element is encapsulated with resin in a packaging process.

With recent downsizing of electronic devices, semiconductor devices have been becoming even smaller. Special focus has been put on the effort to make semiconductor elements as thin as possible. Thinly machined semiconductor wafers are divided into pieces whereby each has a semiconductor element mounted thereon, and sent individually to a packaging process. Conventionally, prior to the thinning process, in order to enhance their strength of wafers, the wafers are attached to a protective sheet on which pressure sensitive adhesives is coated. After this process, the tackiness of the pressure sensitive adhesives is reduced, and then thinned wafers are removed from the protective sheet.

The thinned semiconductor wafers are, however, vulnerable to external force, thus they can easily be damaged during removal of the protective sheet. Even when the protective sheet is removed without causing any damage, the semiconductor elements tend to suffer problems such as heat cracks generated by thermal stress while they are encapsulated with resin. Thus, it has been difficult to secure reliability of the product. The protective sheets used in the conventional method are consumables and thrown away after one use. This increases waste. As such, the conventional method is not desirable in terms of cost and environmental protection.

The present invention aims at providing highly reliable semiconductor devices and methods of manufacturing the same.

SUMMARY OF THE INVENTION

The method of manufacturing a semiconductor device of the present invention includes steps of;
   a resin layer forming step in which a face with electrodes of a semiconductor wafer having a plurality of semiconductor elements mounted thereon is coated with a resin layer which has a function of sealing the face; and
   a thinning step conducted subsequently, in which the back face of the semiconductor wafer is thinned.

The method of manufacturing the semiconductor device of the present invention further includes a process of forming a conductive section on the electrodes of the semiconductor wafer with a plurality of semiconductor elements in such a manner the conductive section contacts with the electrodes.

The method of manufacturing the semiconductor device of the present invention still further includes a process of cutting the semiconductor wafer having a plurality of semiconductor elements along boundaries of each semiconductor element.

In the thinning process, at least one method selected from a mechanical thinning method, a chemical etching method and a plasma etching method is used.

The semiconductor devices of the present invention are manufactured by the foregoing manufacturing method.

According to the present invention, a face of a semiconductor wafer where electrodes are disposed is coated with a resin layer which seals the face with electrodes, and subsequently, the back face of the semiconductor wafer is thinned by machining. In other words, the semiconductor wafer is reinforced by the resin layer while it is being thinned. Therefore, the semiconductor wafers can be evenly thinned. Further, since the protective sheets are not used, the semiconductor wafers are free of destruction or damage conventionally caused while the protective sheets are being removed. In the same manner, the semiconductor wafers do not suffer damage when the wafers are cut (divided) after the thinning process, since they are reinforced by the resin layer.

DESCRIPTION OF THE PREFERRED EMBODIMENTS

The First Preferred Embodiment

Figure 1:
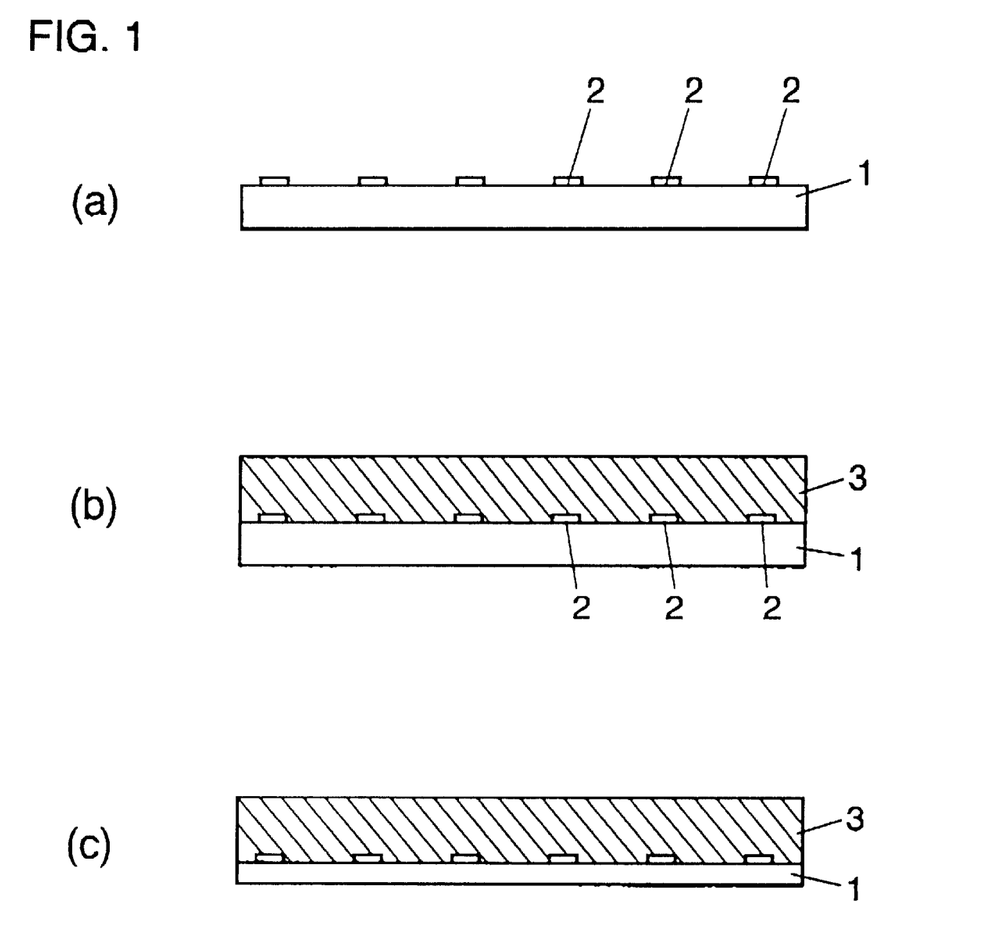
FIG. 1 shows a process diagram of a manufacturing method of a semiconductor device in accordance with a first preferred embodiment of the present invention.
Figure 2:
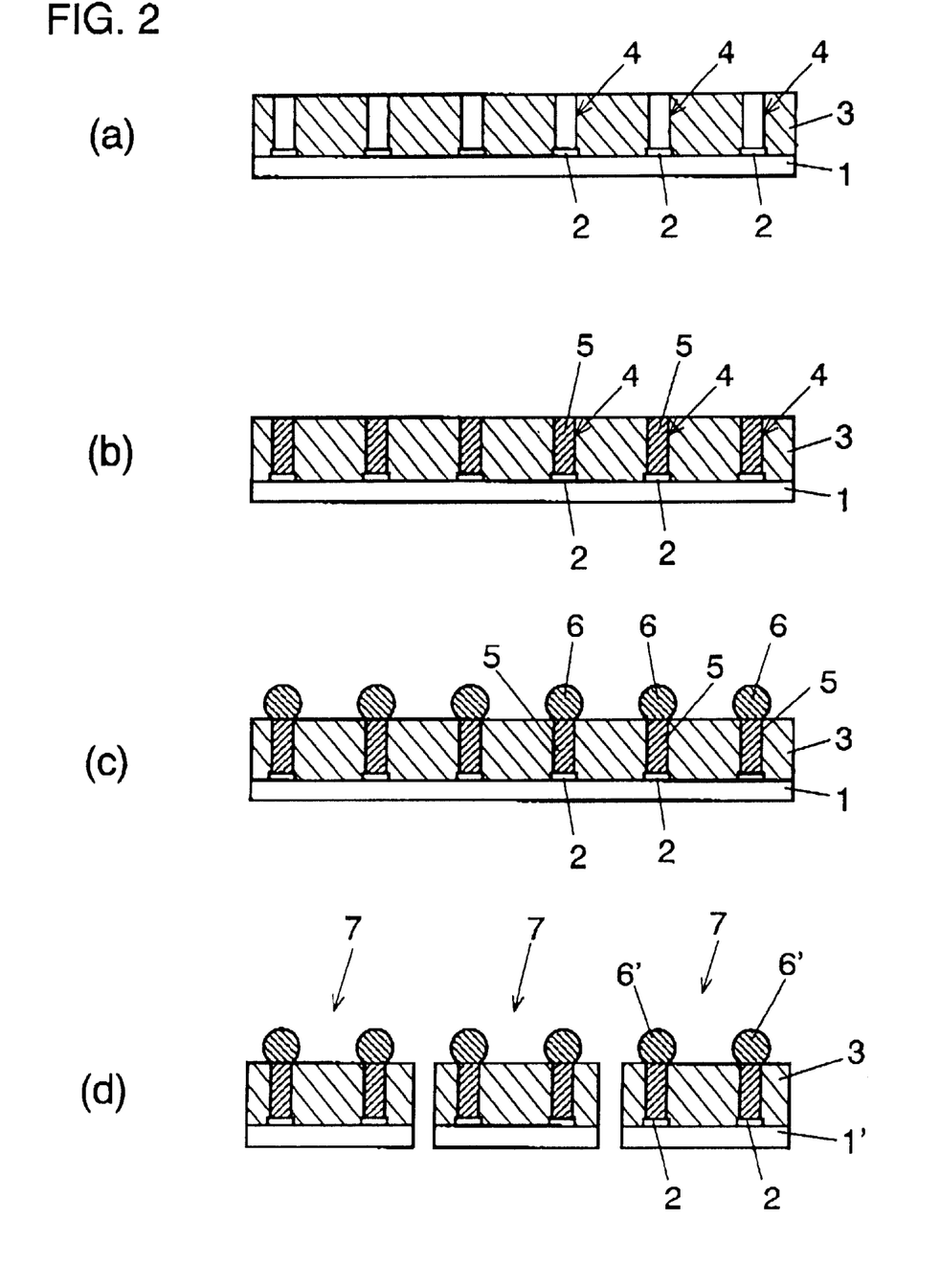
FIG. 2 shows a process diagram of the manufacturing method of the semiconductor device in accordance with the first preferred embodiment of the present invention.

FIGS. 1 and 2 show process diagrams of the manufacturing method of the semiconductor device of the first preferred embodiment of the present invention. FIGS. 1 and 2 illustrate the manufacturing method of the semiconductor device in the order of process.

In FIG. 1(*a*), disposed on the top surface of a semiconductor wafer 1 where a plurality of semiconductor elements is formed, are electrodes 2 for external connection. The semiconductor wafer 1 has a sufficient thickness (about 1 mm) to resist the thermal stress during the subsequent process of forming the resin layer.

As FIG. 1(*b*) shows, a resin layer 3 is formed on the top surface of the semiconductor wafer 1 where the electrodes are formed. The resin layer 3 not only protects surface of the semiconductor wafer 1 but also functions as a sealing (passivation) resin even after the semiconductor elements are cut out from the semiconductor wafer 1 as independent semiconductor devices.

Thus, for the resin layer 3, resin materials superior in respect of sealing function to protect the semiconductor elements are selected. The sealing function here means a function to protect functional materials composing substantially semiconductor elements especially those metals which compose electrodes such as aluminum, copper chromium and titanium, from dissolving, corrosion and electric erosion. In other wards, resin materials used in the resin layer 3 must have an adequate humidity resistance, migration resistance, adequate strength against external force and electrical insulating properties as a sealer. Resins generally used to produce semiconductor devices can be used. To achieve even higher effects of the present invention, resins can be mixed with fillers such as silica, alumina, zirconia, quartz fibers, glass fibers and resin fibers to enhance mechanical strength. It is especially effective to add inorganic fine particles capable of absorbing ionic impurities to the resin in terms of protecting electrodes and preventing migration. One example of such inorganic particles is "IXE" (trade name) produced by the Toa Gosei Chemical Industry Co., Ltd.

As for the methods of forming the resin layer, resin film adhering method or resin coating method can be used.

In the resin film coating method, resin materials such as epoxy resin or polyimide resin sheet is coated with an adhesive on one surface and adhered on the semiconductor wafer 1. Subsequently, the adhesive is thermally cured to tightly bond the resin film with the semiconductor wafer 1. When adhesives are not used, epoxy resin sheet of B—stage can be adhered and then thermally cured.

The function of the resin layer 3 is not limited to the protective function of the semiconductor devices. It also has effective function even after the semiconductor device is mounted on a circuit board. As it is mentioned later in this specification, the semiconductor device of the present invention used extremely thin semiconductor wafers. In general, semiconductor devices using thin semiconductor wafers are susceptible to stresses placed upon during and after mounted on a circuit board, and, in some cases, suffer breaking of connections between the circuit board and electrodes. Since the resin layer 3 cushions stress, very stable and reliable connection can be achieved as the semiconductor device of the present invention uses extremely thin semiconductor wafer.

In the resin coating method, liquid resin is coated at a predetermined thickness on the face of the semiconductor wafer 1 where electrodes are disposed, and cured. In this case, apart from the heat curing method, a photo-curing method, an electron beam curing method or other methods can be used.

The semiconductor wafer 1 coated with the resin layer 3 is sent to a thinning process. In this process, as FIG. 1(c) shows, the back face of the semiconductor wafer 1, namely, the face without the resin layer 3, is ground and thinned by mechanical grinding to less than 300 $\mu$m preferably about 100 $\mu$m. In this grinding process, since the semiconductor wafer 1 is reinforced by the resin layer 3, damage or destruction of the semiconductor wafer 1 caused during grinding can be prevented. Further, as the semiconductor wafer 1 is reinforced by the resin layer 3, the semiconductor wafer 1 can be made as thin as less than 50 $\mu$m.

For this thinning process, apart from the mechanical grinding method, a plasma etching method and chemical etching method using chemicals can be used to etch and remove the surface layer on the back of the semiconductor wafer 1. For the purpose of precise chemical etching, a spin coater is effectively used.

Further, the back face of the semiconductor wafer 1 ground by the mechanical grinding method, can be subsequently treated with the plasma etching method. The plasma etching treatment can remove the layer with micro-cracks on the back face of the semiconductor wafer 1, and improve the strength of the semiconductor wafer 1.

In the plasma etching method, fluorine or chlorine derived gas is used as an etching gas. In the chemical etching of silicon wafer, mixed solution of fluoric acid and nitric acid may be used.

Further, the back face of the semiconductor wafer 1 ground by the mechanical grinding method can be subsequently treated with the plasma etching method or with chemical etching method. The plasma etching or chemical etching treatment can remove the layer with micro-cracks on the back face of the semiconductor wafer 1, and improve the strength of the semiconductor wafer 1.

As FIG. 2(a) shows, blind holes are formed on the resin layer 3 by a laser. By irradiating a laser light on the positions corresponding to the electrodes 2, blind holes 4 which are open to the surface of the electrodes 2 are formed on the resin layer 3. Applicable lasers include a carbon dioxide laser, a YAG laser and excimer lasers. The carbon dioxide laser is capable of making holes only on the resin layer without affecting the electrodes while the excimer lasers are advantageous in terms of forming fine holes.

Subsequently as FIG. 2(b) shows, the blind holes 4 are filled with a solder paste 5, a conductive paste.

On the solder paste 5 which fills the blind holes 4, solder balls 6 are then mounted as shown in FIG. 2(c). After this step, the semiconductor wafer 1 is heated in a reflow process to melt the solder paste 5 and the solder balls 6. After molten solder is solidified, protrusive solder bumps 6' connected to the electrodes 2 are formed on the resin layer 3.

After forming solder bumps, the semiconductor wafer 1 is sent to a cutting process where it is cut along the boundaries of each semiconductor element 1' which composes the semiconductor wafer 1, to complete a semiconductor device 7. The semiconductor device 7 manufactured in the manner described above has a face with electrodes sealed by the resin layer 3.

Compared with similar semiconductor devices manufactured by a conventional method, the semiconductor device 7 manufactured by the method of this embodiment has superior properties described below.

(1) Since the semiconductor wafer 1 is ground and thinned after its face with electrodes is sealed with the resin layer 3, the semiconductor wafer 1 is reinforced more firmly compared with the conventional method in which protective sheets are used. Thus, the semiconductor wafer 1 can be ground even thinner than the conventional manufacturing method, without causing any damage.

(2) The process to remove the protective sheets after the thinning process required in the conventional methods is no longer necessary, therefore, the semiconductor wafer 1 is free of damage caused by the external force placed upon during the removal of the protective sheet as well as during cutting. Therefore, a semiconductor device with superior reliability can be achieved. Further, since the consumable protective sheets are not used, problems of waste treatment caused by disposal of protective sheets after use do not exist.

The Second Preferred Embodiment

Figure 3:
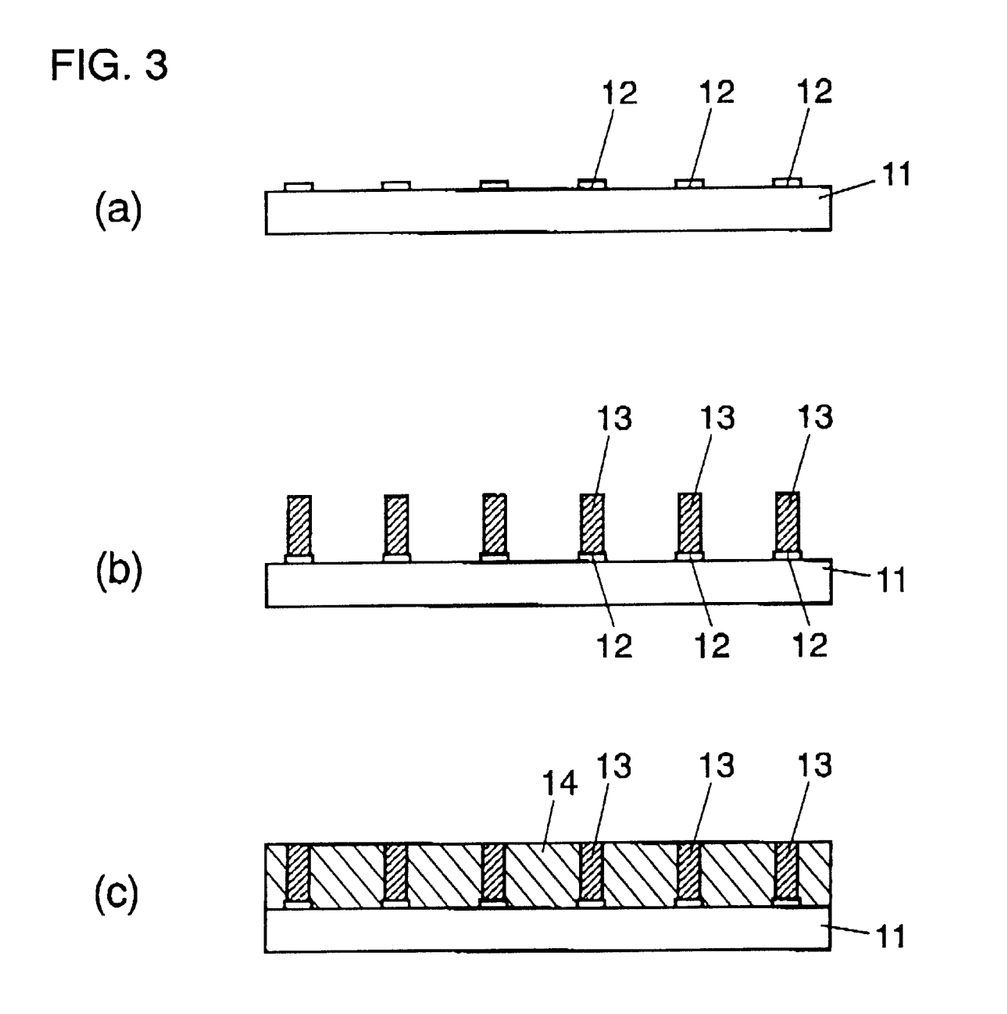
FIG. 3 shows a process diagram of a manufacturing method of a semiconductor device in accordance with a second preferred embodiment of the present invention.
Figure 4:
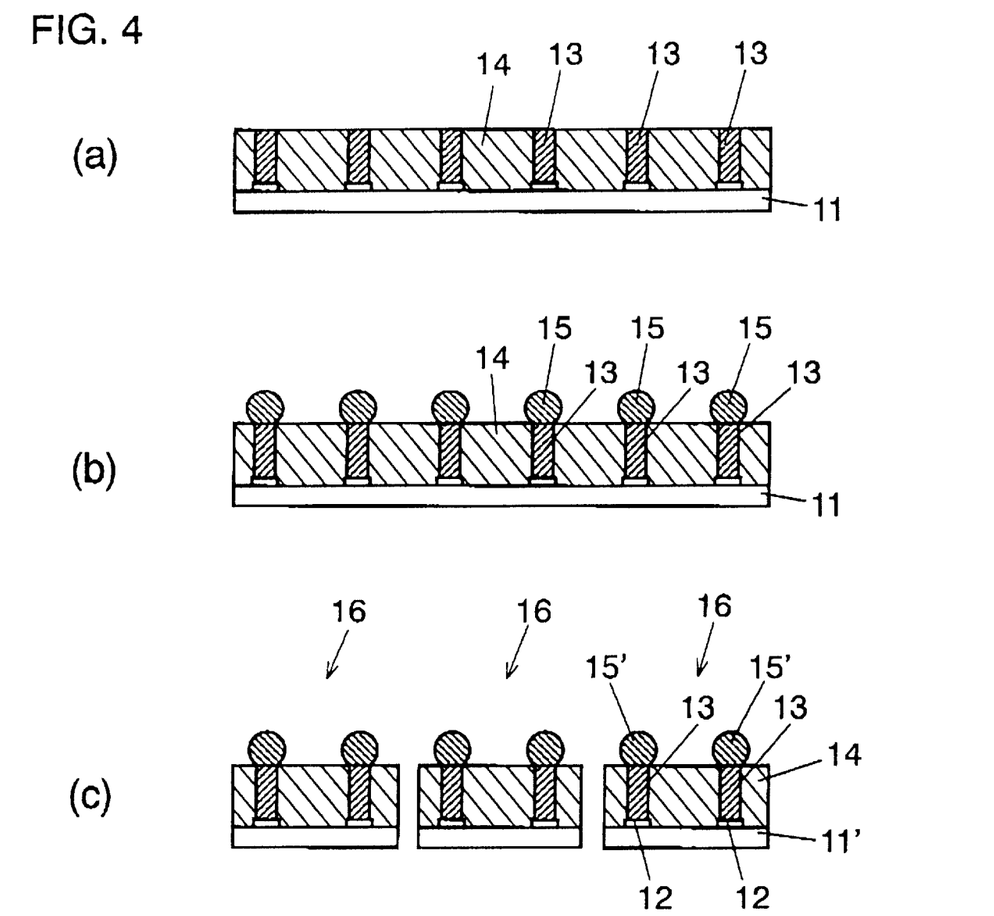
FIG. 4 shows a process diagram of the manufacturing method of the semiconductor device in accordance with the second preferred embodiment of the present invention.

FIGS. 3 and 4 show process diagrams of the manufacturing method of the semiconductor device of the second preferred embodiment of the present invention. FIGS. 3 and 4 illustrate the manufacturing method of the semiconductor in the order of process.

In FIG. 3(a), similar to the semiconductor wafer of the first preferred embodiment, a plurality of semiconductor elements is disposed on a semiconductor wafer 11. On the top of the semiconductor wafer 11 are electrodes 12 for external connection. As FIG. 3(b) shows, a conductive section 13 is formed on the electrodes 12 for external connection. The conductive section 13 is formed, for example, by laminating metallic plating layers on the top face of the electrodes 12. The semiconductor wafer 11 having the conductive section 13 formed thereon is sealed with resin in a similar manner to the first preferred embodiment. In this embodiment, on the surface of the semiconductor wafer 11 where the electrodes 12 and the conductive sections 13 are formed, a resin layer 14 with sealing function is formed. For the resin layer 14, similar materials for the resin layer 3 in the first preferred embodiment are used.

The semiconductor wafer 11 coated with the resin layer 14 is sent to a thinning process. In this process, as FIG. 4(a) shows, the back face of the semiconductor wafer 11 is ground and thinned in a grinding process in a similar manner to the first preferred embodiment. In this grinding process, since the semiconductor wafer 11 is reinforced by the resin layer 14, damage or destruction of the semiconductor wafer 11 caused during grinding can be prevented.

For this thinning process, apart from the mechanical grinding method, plasma etching method or chemical etching method can be used to remove the surface layer on the back face of the semiconductor wafer 11. Further, the back face of the semiconductor wafer 11 ground by the mechanical grinding method can be subsequently treated with the plasma etching method.

On the conductive section 13, solder balls 15 are mounted as shown in FIG. 4(b). After this step, the semiconductor wafer 11 is sent to and heated in a reflow process to melt the solder balls 15 and connect them with the conductive section 13. When molten solder is solidified, protruding solder bumps 15' (shown in FIG. 4(c)) are formed on the resin layer 14.

After forming the solder bumps, the semiconductor wafer 11 is cut into pieces along the boundaries of each semiconductor element 11' to complete a semiconductor 16 in which the resin layer 14 seals the face where the electrodes for external connection are disposed. The semiconductor device 16 has superior properties similar to the semiconductor device 7 of the first preferred embodiment.

In the second preferred embodiment, the conductive section 13 is formed by plating, however, it can be formed by wire bumps produced by wire bonding or ball bumps produced by connecting metallic balls. The wire bumps and ball bumps are advantageous over the plating in terms of cost of forming the conductive section 13.

The Third Preferred Embodiment

Figure 5:
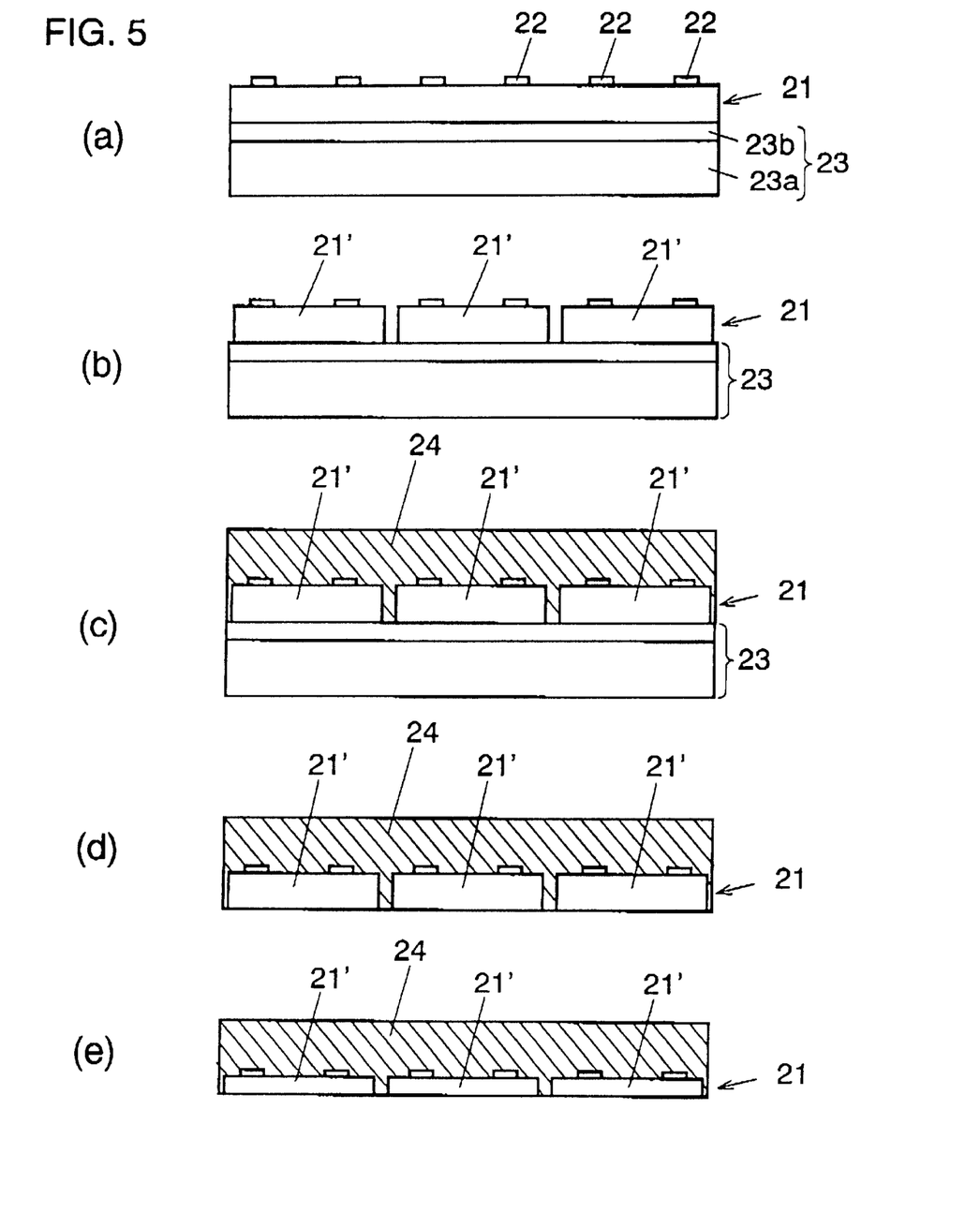
FIG. 5 shows a process diagram of a manufacturing method of a semiconductor device in accordance with a third preferred embodiment of the present invention.
Figure 6:
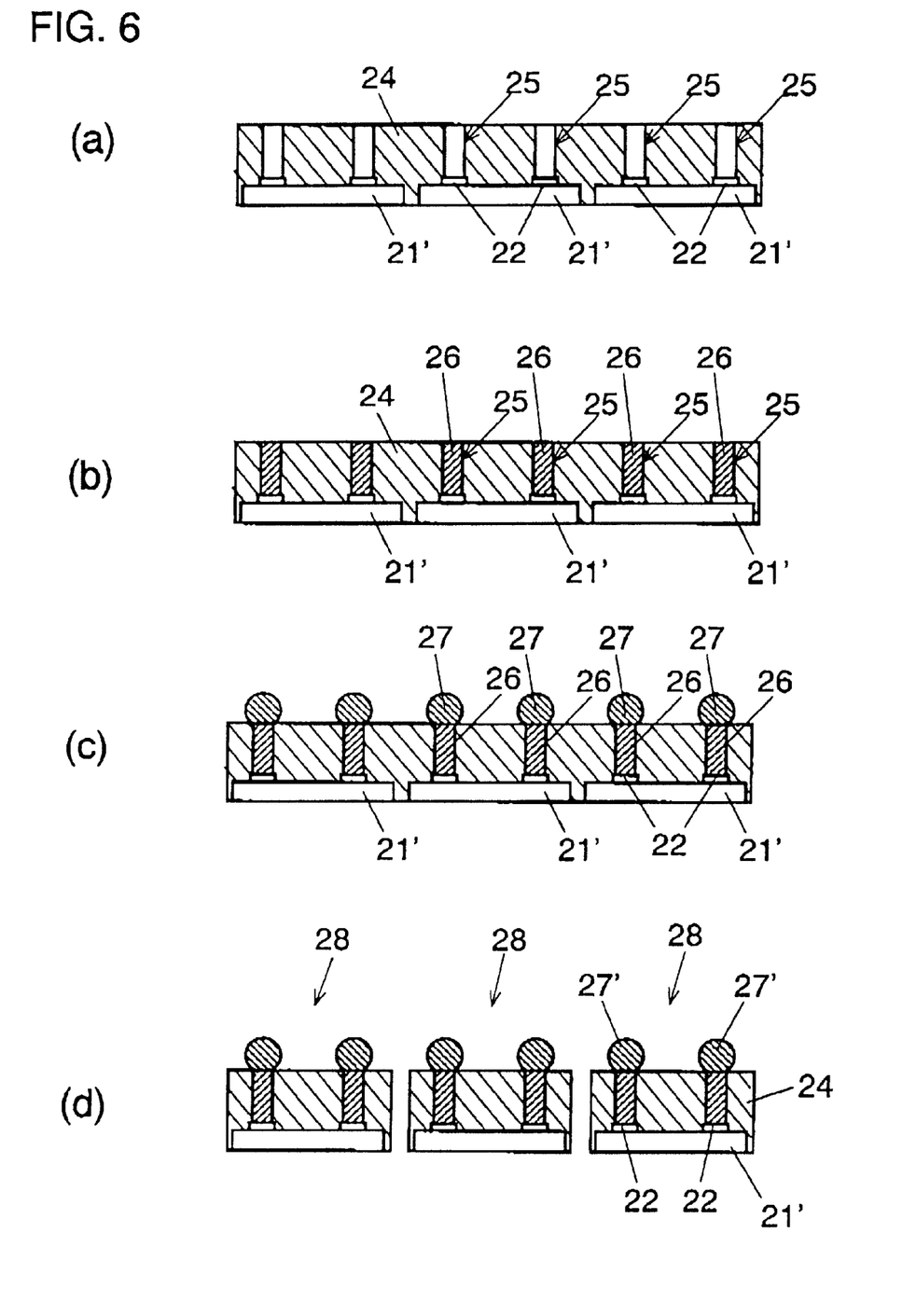
FIG. 6 shows a process diagram of the manufacturing method of the semiconductor device in accordance with the third preferred embodiment of the present invention.

FIGS. 5 and 6 show process diagrams of the manufacturing method of the semiconductor device of the second preferred embodiment of the present invention. FIGS. 5 and 6 illustrate the manufacturing method of the semiconductor in the order of process.

In FIG. 5(a), electrodes 22 for external connection are disposed on the top surface of a semiconductor wafer 21 where a plurality of semiconductor elements is formed in a similar manner to the semiconductor wafer of the first preferred embodiment. A protective sheet 23 is bonded on the bottom surface of the semiconductor wafer 21. The protective sheet 23 is prepared such that a pressure sensitive adhesive layer 23b is coated on a resin film 23a. When adhered on the semiconductor wafer 21, the protective sheet 23 reinforces it.

The semiconductor wafer 21 is sent to a cutting process while being reinforced by the protective sheet 23, and cut along the boundaries of each semiconductor element 21' as shown in FIG. 5(b). As a result of this step, the semiconductor wafer 21 becomes such that each semiconductor element 21' is connected by the protective sheet 23.

In this condition, a resin layer 24 is formed on the face of the connected semiconductor wafer 21' (hereinafter, connected semiconductor wafer) where electrodes are disposed as shown in FIG. 5(c). As is the case with the resin layers 3 and 14 respectively of the first and second preferred embodiment, the resin layer 24 has a function of sealing the face with the electrodes.

Subsequently, the protective sheet 23 is removed from the connected semiconductor wafer on which the resin layer 24 is formed. With this step, the face of the connected semiconductor wafer where the electrodes are disposed, is sealed with the resin layer 24 as shown in FIG. 5(d). The connected semiconductor wafer is sent to a thinning process in this condition, and the back face of each semiconductor element 21' is ground and thinned by a mechanical grinding process. In this grinding process, since the semiconductor elements 21' are reinforced by the resin layer 24, damage or destruction caused by the stress during grinding can be prevented. For this thinning process, similar to the first preferred embodiment, the plasma etching method or chemical etching method can be used to remove the surface layer on the back of the semiconductor wafer 21 other than the mechanical grinding method. Further, the back face of the semiconductor wafer 21 ground by the mechanical grinding method, can be subsequently treated with the plasma etching method.

The connected semiconductor wafer is then sent to a blind hole forming process. Similar to the first preferred embodiment, in this process, blind holes 25 which reaches to the surface of the electrodes 22 are formed on the resin layer 24 at the positions corresponding to the electrodes 22 as shown in FIG. 6(a). Subsequently, as FIG. 6(b) shows, the blind holes 25 are filled with a solder paste 26. On the solder paste 26, solder balls 27 are mounted as shown in FIG. 6(c). After this step, the connected semiconductor wafer is heated in a reflow process, the solder paste 26 and the solder balls 27 are melted and protruding solder bumps 27' which are connected to the electrodes 22 are formed on the resin layer 24.

After forming solder bumps, the connected semiconductor wafer is sent to a cutting process where the resin layer 24 is cut along the boundaries of each semiconductor element 21' as shown in FIG. 6(d) to complete a semiconductor device 28 in which face with electrodes for external connection is sealed with the resin layer 24 . The semiconductor device 28 also enjoys superior properties similar to the semiconductor device 7 of the first preferred embodiment.

As described in the first, second and third preferred embodiments, according to the present invention, after the resin layer with sealing function is formed on the face of the semiconductor wafer where electrodes are disposed, the back face of the semiconductor wafer is ground and thinned. This method has the following effects.

(1) Even and thin semiconductor elements can be achieved since the semiconductor wafer is adequately reinforced during the thinning process.

(2) Since protective sheets do not have to be removed after the thinning process, associated destruction of or damage to the semiconductor wafers does not occur.

(3) Since disposable protective sheets are not required, not only manufacturing cost can be reduced but also, with no waste being generated, stress placed on the environment can be eliminated.

According to the present invention, reliable semiconductor devices can be produced environmentally soundly at low cost.

What is claimed is:

1. A method of manufacturing a semiconductor device comprising the steps of:
   providing a semiconductor wafer having a face and a back face, the face having a plurality of semiconductor elements formed thereon, said plurality of semiconductor elements each including at least one electrode,
   forming a resin layer on the semiconductor wafer face
   grinding and thinning the back face of the semiconductor wafer;
   forming a blind hole in the resin layer over at least one of said electrodes; and
   forming a conductive section in the blind hole, the conductive section connected to the at least one formed electrode.

2. The method of manufacturing a semiconductor device of claim 1, further comprising a step of forming a conductive section on the electrodes of the semiconductor wafer.

3. The method of manufacturing a semiconductor device of claim 2, in which the conductive section is formed by one of a plating method, a wire bonding method and a method of connecting metallic balls.

4. The method of manufacturing a semiconductor device of claim 1, further comprising a step of cutting the semiconductor wafer along boundaries of the semiconductor elements.

5. The method of manufacturing a semiconductor device of claim 2, further comprising a step of cutting the semiconductor wafer along boundaries of the semiconductor elements.

6. The method of manufacturing a semiconductor device of claim 1, in which the thinning process is carried out by at least one of a mechanical grinding method, a chemical etching method and a plasma etching method.

7. The method of manufacturing a semiconductor device of claim 2, in which the thinning process is carried out by at least one of a mechanical grinding method, a chemical etching and a plasma etching.

8. The method of manufacturing a semiconductor device of claim 4, in which the thinning process is carried out by at least one of a mechanical grinding method, a chemical etching and a plasma etching.

9. The method of manufacturing the semiconductor device of claim 1, wherein the conductive section is formed of conductive paste filled in the blind hole.

10. The method of manufacturing the semiconductor device of claim 1, wherein the conductive section comprises a solder portion.

11. A method of manufacturing a semiconductor device comprising the steps of:
    forming a conductive section on electrodes of a plurality of semiconductor elements disposed on a semiconductor wafer;
    forming a resin layer on a face of the semiconductor wafer;
    grinding and thinning a back face of the semiconductor wafer; and
    forming a bump on the conductive section.

12. The method of manufacturing the semiconductor device of claim 11, wherein the conductive section is formed by one of a plating method, a wire bonding method and a method of connecting metallic balls.

13. A method of manufacturing the semiconductor device comprising the steps of:
    bonding a protective sheet on a back face of a semiconductor wafer, the semiconductor wafer having a plurality of semiconductor elements formed on a top face thereof;
    dividing the semiconductor wafer while being bonded with the protective sheet;
    forming a resin layer on the top face of the semiconductor wafer;
    peeling off the protective sheet after the resin layer forming process;
    grinding and thinning the back face of the semiconductor wafer; and
    dividing the resin layer to obtain an individual semiconductor device.

14. The method of manufacturing a semiconductor device of claim 13, wherein the plurality of semiconductor elements includes at least one electrode, the method further comprising the steps of:
    forming a blind hole in the resin layer over the at least one electrode; and
    forming a conductive section in the blind hole, the conductive section being electrically connected to the electrode.

15. The method of manufacturing the semiconductor device of claim 14, wherein the conductive section is formed of a conductive paste filled in the blind hole.

16. The method of manufacturing the semiconductor device of claim 14, wherein the conductive section comprises a solder portion.

17. The method of manufacturing a semiconductor device comprising the steps of:
    providing a semiconductor wafer having a face and a back face, the face having a plurality of semiconductor elements formed thereon, said plurality of semiconductor elements each including at least one electrode,
    forming a resin layer having a sealing function on the face of the semiconductor wafer;
    grinding and thinning the back face of the semiconductor; and
    treating the back face with a plasma etching to remove a layer with micro-cracks on the back face.

18. The method of manufacturing a semiconductor device of claim 17, further comprising the steps of:
    forming a blind hole in the resin layer over an electrode of the plurality of semiconductor elements; and
    forming a conductive section in the blind hole, the conductive section being connected to the electrodes.

19. The method of manufacturing the semiconductor device of claim 18, wherein the conductive section is formed of a conductive paste filled in the blind hole.

20. The method of manufacturing the semiconductor device of claim 18, wherein the conductive section comprises a solder portion.

21. The method of manufacturing the semiconductor device of claim 17, further comprising a step of forming a conductive section on the at least one electrode before the resin layer forming process.

22. The method of manufacturing the semiconductor device of claim 21, wherein the conductive section is formed by one of a plating method, a wire bonding method and a method of connecting metallic balls.

* * * * *